United States Patent [19]
Yamaguchi et al.

[11] Patent Number: 5,821,483
[45] Date of Patent: Oct. 13, 1998

[54] MODULAR ARRAY OF SWITCHES, SWITCH ACTUATORS, PRINTED CIRCUIT BOARDS, HOUSING AND ELECTRICAL CONNECTOR

[75] Inventors: Kiyotaka Yamaguchi, Nagoya; Yasuhide Tanaka, Owariasahi, both of Japan

[73] Assignee: Omron Corporation, Nagaokakyo, Japan

[21] Appl. No.: 584,432

[22] Filed: Jan. 11, 1996

[30] Foreign Application Priority Data

Jan. 11, 1995 [JP] Japan .................................. 7-019785

[51] Int. Cl.$^6$ ...................................................... H01H 9/00
[52] U.S. Cl. ........................................... 200/5 R; 361/781
[58] Field of Search ..................................... 200/1 R, 5 R, 200/5 A, 1 B, 6 R, 6 B, 11 DA, 11 TW, 14, 17 R, 18, 292; 361/679, 748, 760, 781; 439/63, 65, 44

[56] References Cited

U.S. PATENT DOCUMENTS

| | | | |
|---|---|---|---|
| 3,745,270 | 7/1973 | Granitz | 200/16 C |
| 3,754,106 | 8/1973 | MacDonald | 200/14 |
| 4,029,914 | 6/1977 | Schmidt et al. | 200/1 R |
| 4,057,520 | 11/1977 | Schwartz | 200/16 D |
| 4,107,499 | 8/1978 | Weidler | 200/5 R X |
| 4,272,658 | 6/1981 | Crosby | 200/6 B |
| 4,331,851 | 5/1982 | Johnson | 200/5 A X |
| 4,520,429 | 5/1985 | Hosking | 200/5 R X |
| 4,739,139 | 4/1988 | Ikeda | 200/294 |
| 4,816,961 | 3/1989 | Saulgeot et al. | 200/293 |
| 5,182,700 | 1/1993 | Weimer | 361/781 |
| 5,190,461 | 3/1993 | Oorui et al. | 439/63 |
| 5,350,889 | 9/1994 | Lauritsen | 200/1 B |
| 5,412,164 | 5/1995 | Conway et al. | 200/1 B |
| 5,412,166 | 5/1995 | Krupp et al. | 200/6 R |

*Primary Examiner*—J. R. Scott
*Attorney, Agent, or Firm*—Foley & Lardner

[57] ABSTRACT

An objective of the invention is to provide a power window switch apparatus for an automobile such that the circuit boards within the case which hold the electronic components could be soldered on one side only, thereby reducing production cost and making it easier to lead the wiring pattern around the boards despite the space limitations imposed by the car door. The freedom with which the circuit boards could be designed is also increased. Circuit boards are built into a case facing each other at right angles to the surface on which operating knobs are arranged in a row. This arrangement makes it easy to solder modular switches and wiring terminals of the connector to the circuit boards on one side only. It also makes it possible to increase the surface area of the circuit boards to the very limit of the height restriction imposed on the switch apparatus by the automobile door.

11 Claims, 5 Drawing Sheets

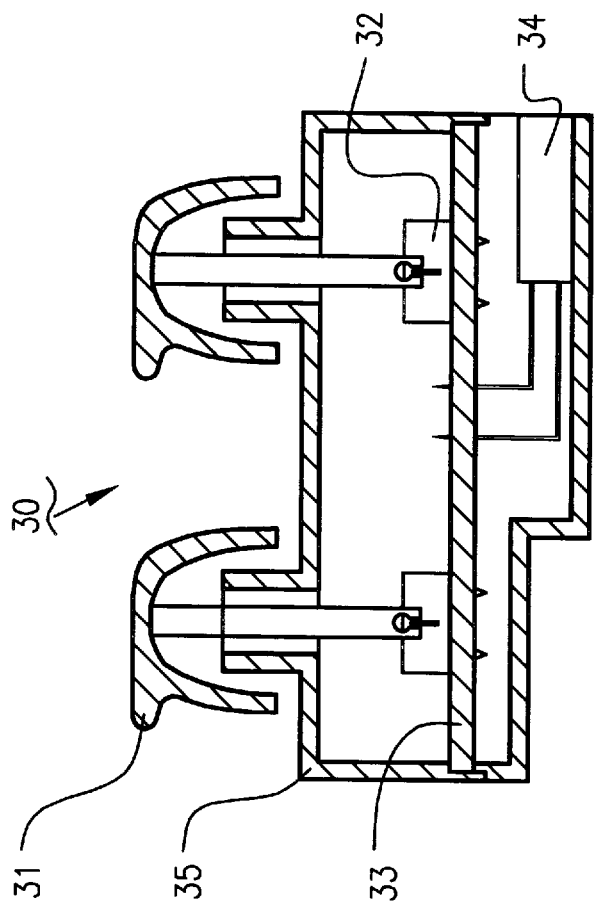
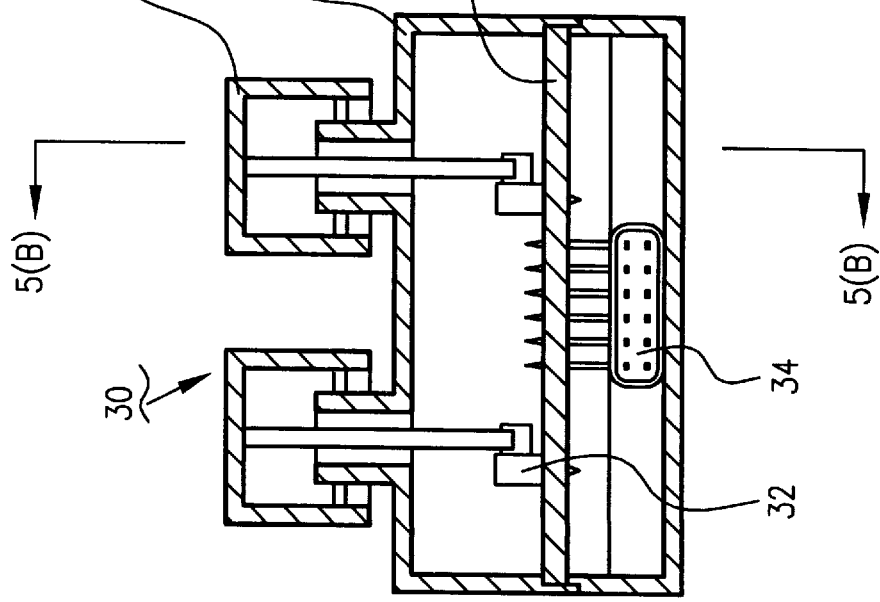
FIG. 5(A)
FIG. 5(B)

MODULAR ARRAY OF SWITCHES, SWITCH ACTUATORS, PRINTED CIRCUIT BOARDS, HOUSING AND ELECTRICAL CONNECTOR

FIELD OF THE INVENTION

This invention concerns a switch structure of a switch apparatus to be used in a power window of an automobile.

BACKGROUND OF THE INVENTION

Conventionally, power windows of automobiles have used modular switches with movable contacts which made or broke contact with printed circuit boards. A prior art switch apparatus 30 is hereinafter described with reference to FIGS. 5(A) and 5(B). Operating knobs 31, which raise and lower power windows, are arranged in a row on the tops of cases 35 in such a way that they are free to rotate. Cases 35 contain modular switches 32, circuit boards 33 and connectors 34 for external connection. Circuit boards 33 are oriented horizontally with respect to the surfaces on which operating knobs 31 are arranged. Modular switches 32 are placed on the upper surfaces of circuit boards 33. The contacts for switches 32 are soldered to the lower surface of each board. Connectors 34 are located below circuit boards 33, and their terminals are soldered to the upper surfaces of each board.

The number of processes used in producing a switch apparatus configured as described is reduced if the side of the circuit board which is soldered is the same side on which the electrical components, including the modular switches and the connectors, are arranged. This scheme also allows the use of a board printed on one side only, which is less expensive than a two-sided board, so it is desirable from the point of view of cost reduction.

However, in the prior art switch apparatus 30 pictured in FIGS. 5(A) and 5(B), connectors 34 are underneath circuit board 33. The terminals of modular switches 32 are soldered to one side of circuit board 33, and the terminals of the wiring connecting connectors 34 to the circuits are soldered to the other side. It is thus necessary to solder both sides of circuit board 33. The number of processes cannot be reduced, and an extra cost is incurred.

Considering the space into which a power window switch for an automobile must fit, it is clear that the external dimensions of the switch apparatus are limited in terms of width, depth and height. It follows, then, that the surface area of the circuit board will also be limited if it is oriented horizontally with respect to the surface on which the knobs are installed. When only one side of the circuit board is soldered, leading the pattern around on that side can pose a substantial difficulty.

Furthermore, the knobs must be placed on the top of the case, and the modular switches must be mounted on the circuit board so as to correspond to the knobs. This restricts the freedom which may be exercised in designing the printed wiring and makes it difficult to limit the soldering to one side of the board.

SUMMARY OF THE INVENTION

It is an object of this invention to provide a switch structure of an apparatus such that the terminals of the modular switches and the connectors could be soldered to the same side of the circuit board; the wiring pattern could be led around sufficiently within the space limitations imposed on a switch apparatus for a power window of an automobile; the freedom of the circuit board design would be enhanced; the production process would be simplified; and the cost would be reduced.

To achieve the objectives outlined above, the invention of this application provides a switch apparatus so configured that a number of switches which make or break circuits are enclosed in a case; at least the operable portions of the knobs by which the switches are actuated are arranged in a row on the exterior of the case; and the actuation of the switches is effected by the operation of the knobs. The switches are mounted to a number of circuit boards, which are built into the case facing, the sides of the case being orthogonal to the side on which the operating knobs are arranged.

The invention of this application has the circuit boards built into the case in such a way that the surfaces of the boards on which the switches and other components are mounted, face each other.

The invention of this application has connectors in the space between the circuit boards in the switch apparatus described above to connect these circuits to external circuits.

The invention described above of this application is a power window switch for an automobile such that one of the switch apparatuses described above is installed in an automobile so that operating the aforesaid knob will cause the window to open and close.

In a switch apparatus with the first configuration above, multiple circuit boards are built into a case facing each other and orthogonally oriented with respect to the surface on which the operating knobs are arranged. This scheme makes it easy to have the wiring terminals for the switches and the connectors connected and soldered to the same side of the circuit board. The process of soldering components to two circuit boards can be completed in one step if a single board is soldered and then cut in two. This scheme also allows the area of the circuit board to be increased to the very limit of the height restrictions imposed on the switch apparatus.

In the switch apparatus described in the second configuration, the terminals of the wiring, which links the connectors to the circuit board, are connected from the sides of the boards that face each other. Then only the outward-facing sides of the boards need be soldered. This scheme makes it feasible to solder one surface only.

In the switch apparatus described in the third configuration, the connectors are placed in the space between the circuit boards. This makes it easy to connect the wiring terminals for the switches and connectors to the sides of the boards that face each other. Only one side of each board need be soldered, and an efficient use is made of the space.

The power window switch for an automobile described having such switches has reduced dimensions when a plan view is taken. This makes it easy to install in the limited space of a car door.

BRIEF DESCRIPTION OF THE DRAWINGS

FIG. 5(A) is vertical cross section of a switch apparatus belonging to the prior art. FIG. 5(B) is a cross section taken along line 5(B)—5(B) in FIG. 5(A).

DETAILED DESCRIPTION OF THE INVENTION

Figure 1A:
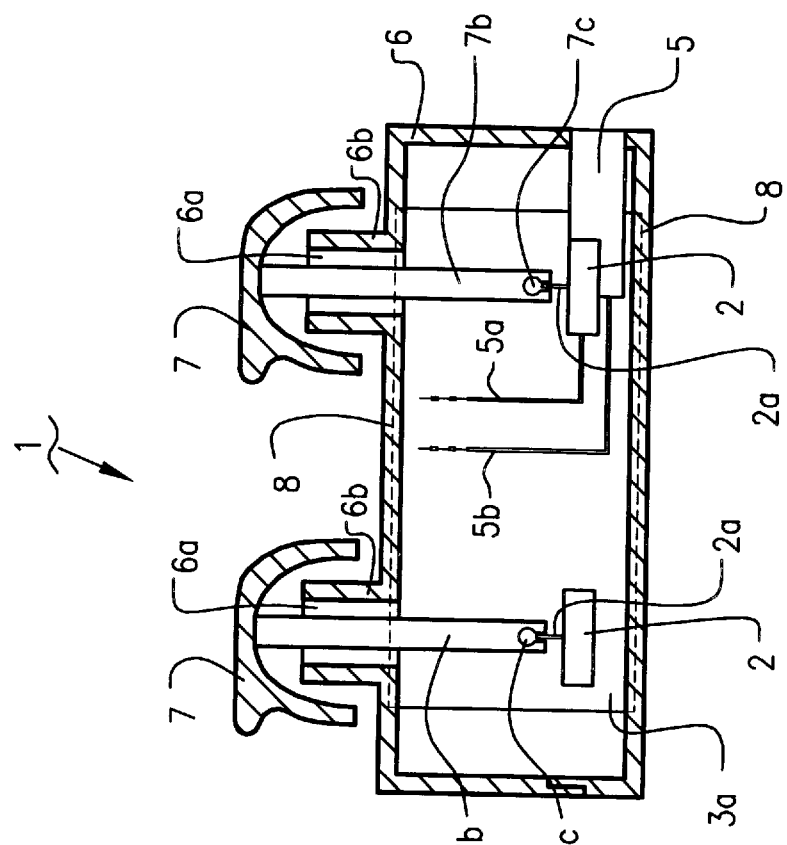
FIG. 1(A) is a vertical cross section of a switch apparatus which is a preferred embodiment of this invention.
Figure 1B:
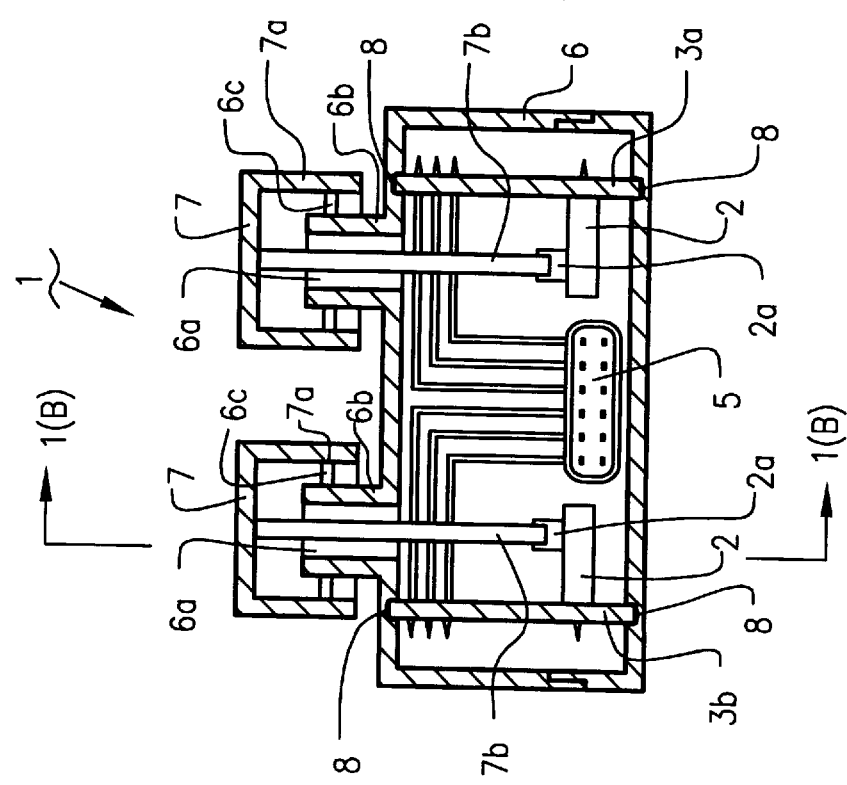
FIG. 1(B) is a cross section taken along line 1(B)—1(B) in FIG. 1(A).

We shall now discuss a preferred embodiment of this invention with reference to the drawings. FIG. 1(A) is a vertical cross section of the switch apparatus. FIG. 1(B) is a cross section taken along line 1(B)—1(B). Switch apparatus 1, which is installed in a power window of an automobile, contains, in case 6, modular switches 2, whose contacts can make and break circuits, printed circuit boards 3a and 3b, on which modular switches 2 and other components are mounted, and connectors 5, to connect the switches to external circuits. Knobs 7, which actuate switches 2, are arranged in a row on the top of case 6 in such a way that their operable portions are exposed.

Circuit boards 3a and 3b face each other and are oriented at a right angle with respect to the surface on which knobs 7 are arranged. The boards on which modular switches 2 and the other components are mounted are fitted into grooves 8 provided on the upper and lower inside surfaces of case 6 so that they face each other. Connectors 5 are installed in the space between circuit boards 3a and 3b. Case 6 has two openings 6a, through which knobs 7 can be connected to switches 2. Two mounts 6b, in which knobs 7 are mounted, are provided on the periphery of each opening 6a. Multiple projections 6c, which serve as the shafts on which knobs 7 rotate, are formed on the outer surfaces which face mounts 6b. When projections 6c are fitted into holes 7a on knobs 7, the shafts of the knobs are supported in such a way that they can freely rotate. Each knob 7 is formed integrally with an arm 7b, which extends downward to actuate the switch. On the end of each arm 7b is a claw 7c, which engages with the element 2a on one of modular switches 2 at a specified clearance. When the arm 7b of knob 7 engages with the switch element 2a, the rotational motion of the knob is converted to linear motion.

Next, the operation of the switch apparatus 1 is discussed with respect to when the power window is raised and lowered. When knob 7 is rotated, its arm 7b rotates with it. Element 2a on modular switch 2, which engages with arm 7b, moves backward or forward in a linear fashion. In this way the movable contact on modular switch 2 is moved toward or away from a fixed contact to make or break a circuit.

Figure 2A:
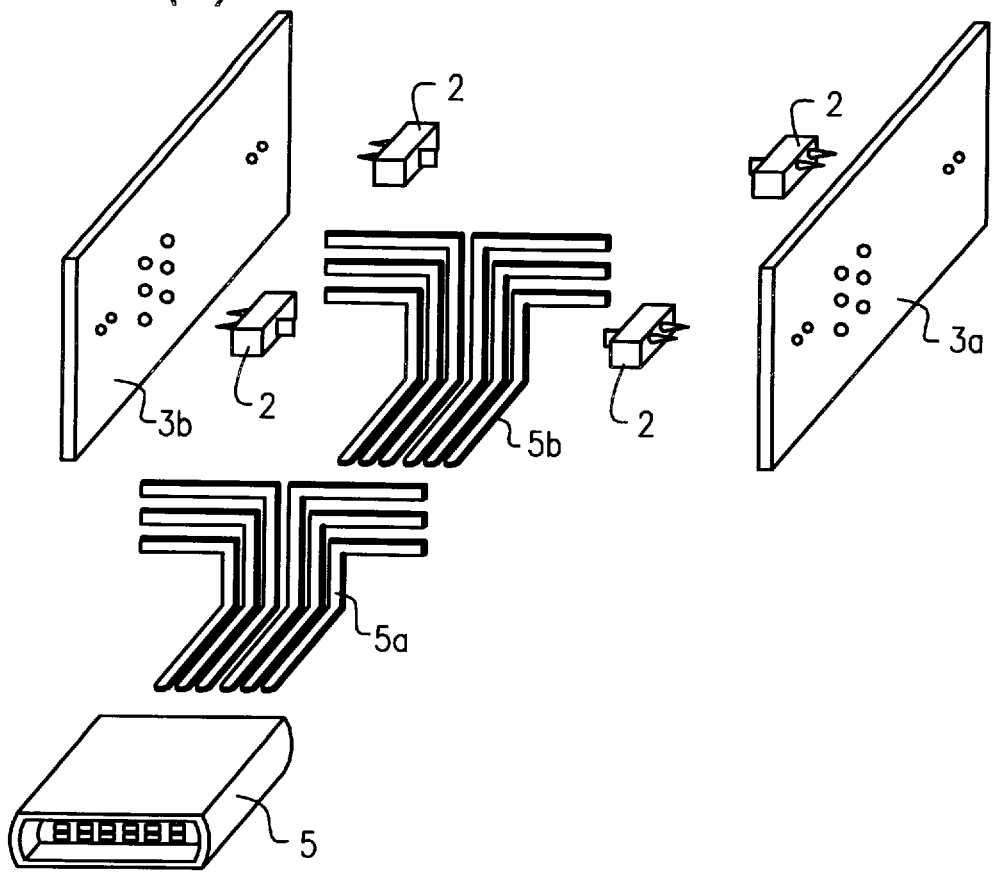
FIG. 2(A) is a perspective drawing showing the modular switches, the connector and the connector terminals before they are mounted on the circuit boards in this switch apparatus.
Figure 2B:
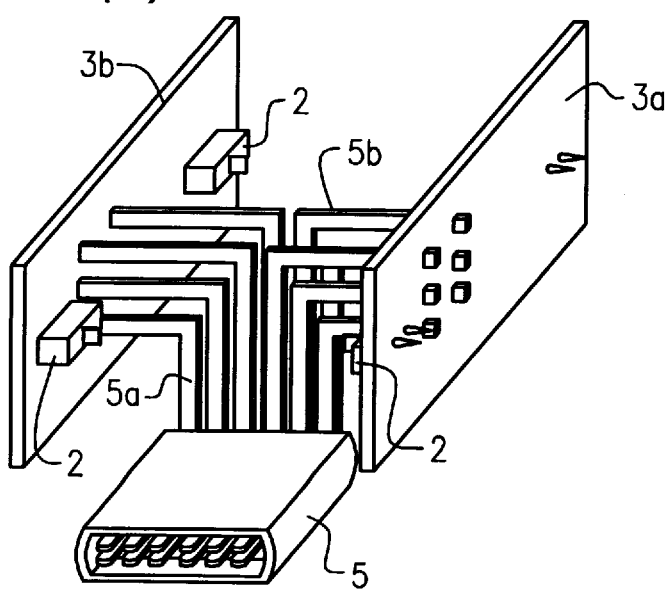
FIG. 2(B) is a perspective drawing of the same components after they are mounted.

FIG. 2(A) shows the assembly stage at which modular switches 2 and connectors 5 are mounted to circuit boards 3a and 3b. As can be seen in FIG. 2(A), modular switches 2, connectors 5 and wiring terminals 5a and 5b for connectors 5 are all installed on the sides of circuit boards 3a and 3b which face each other. Each terminal is inserted in a specified hole in one of circuit boards 3a or 3b. The non-facing sides, that is, the outer sides of boards 3a and 3b, are then soldered; so only one side of each board is soldered. FIG. 2(B) shows how circuit boards 3a and 3b look when connectors 5 and the other components have been mounted on them.

Figure 3:
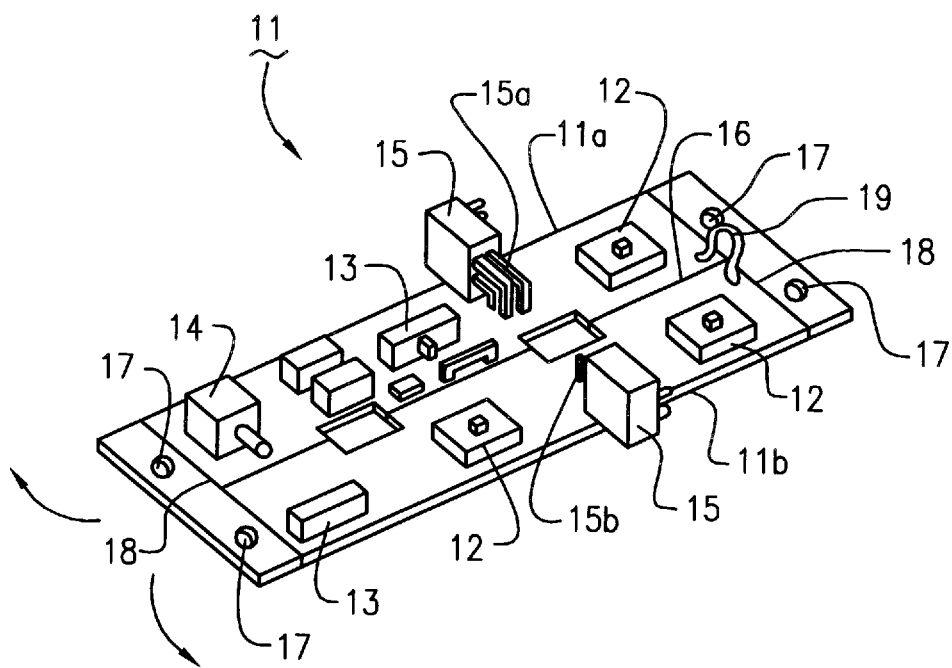
FIG. 3 is a perspective view of a different circuit board which is another preferred embodiment of this invention.
Figure 4:
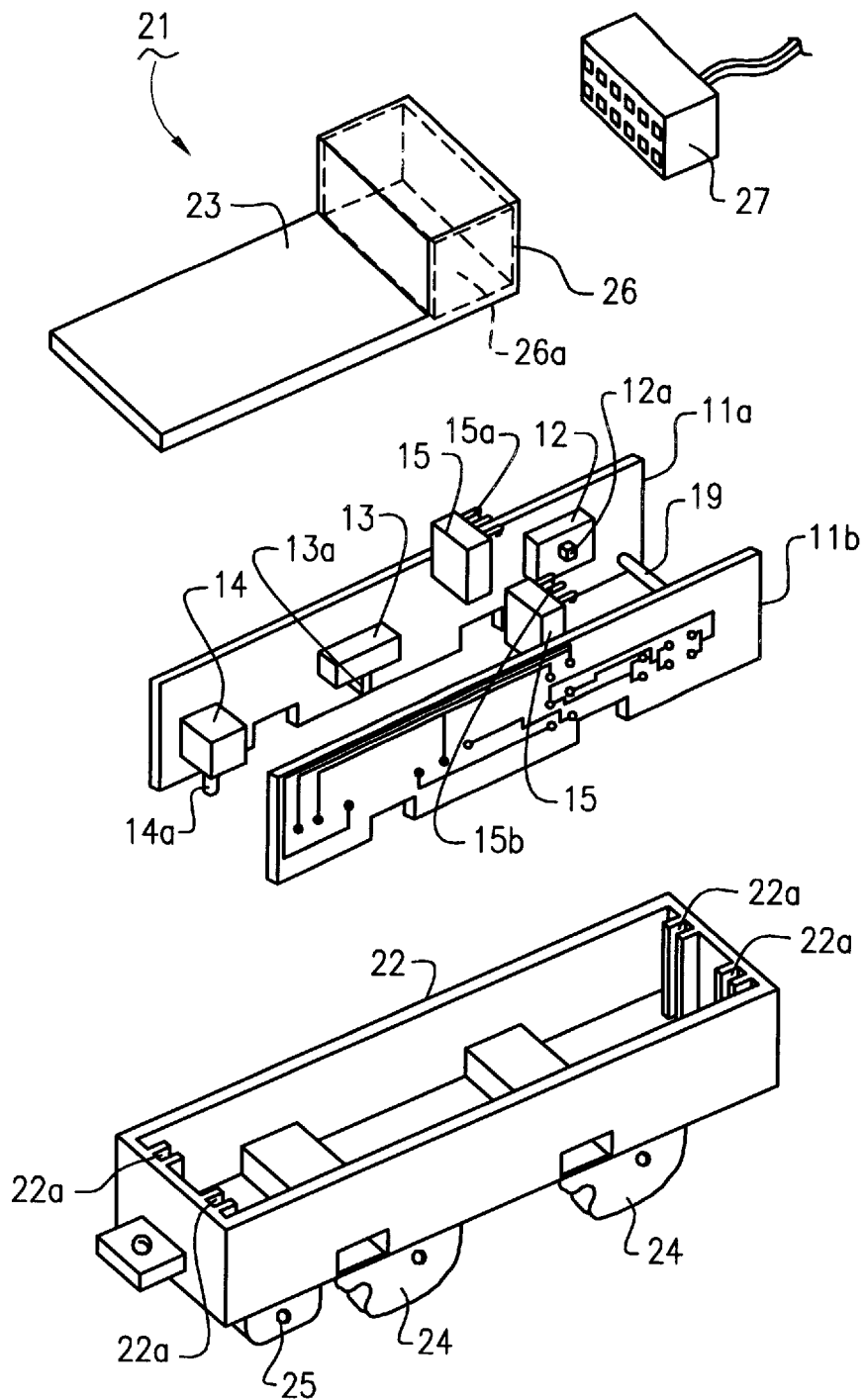
FIG. 4 is an exploded perspective drawing of a switch apparatus which is another preferred embodiment of this invention.

Next, another preferred embodiment of a switch apparatus according to the invention is discussed with reference to FIGS. 3 and 4. In this embodiment, all the electrical components and connector terminals are installed on one side (the front) of a single board, on both sides of which are cut V-shaped grooves 16 so that the board may be broken in two. On the other side (the back) of this board the wiring pattern is formed. After the electrical components have been soldered to the wiring pattern on the back of circuit board 11, the board is separated into two pieces along the V-shaped grooves. FIG. 3 is a perspective drawing of circuit board 11 before it is separated. FIG. 4 is an exploded perspective view of switch apparatus 21, which includes the two separated halves of board 11. Before the two pieces are separated, modular switches 12, 13 and 14, connector terminals 15a and 15b on connectors 15 and other components are mounted on the front of circuit board 11 and soldered to the wiring pattern printed on the back of the board. V-shaped grooves 16 are cut lengthwise on both sides of circuit board 11 so that its two halves may be separated. Positioning holes 17 are cut on each of the length-wise ends of circuit board 11 so that it may be fixed on the production line while electronic components are placed and mounted on it. The portions where holes 17 are cut are severed along grooves 18 after the electronic components have been mounted.

The two ends of lead wire 19 are connected to the front of circuit board 11 on opposite sides of groove 16 so that when the board is split along that groove the two halves, 11a and 11b, will be electrically connected to each other. When circuit board 11 is configured in this way, the electrical components are installed on the front of the board, the back of the board is soldered, and then the board is cut apart along grooves 16 and 18. The two resulting circuit boards, 11a and 11b, are pulled apart as indicated by arrows in FIG. 3 and assembled in switch apparatus 21 with the sides with components on them facing each other.

In addition to circuit boards 11a and 11b, switch apparatus 21 has a case 22 to contain and secure boards 11a and 11b; a cover 23 for the bottom of case 22; and knobs 24 and 25, which are arranged in case 22 so that their operable portions are exposed. When all the components shown in the exploded perspective drawing in FIG. 4 have been assembled, switch apparatus 21 is turned 180° before being installed in an automobile or other vehicle.

The aforesaid case 22 has grooves 22a on its sides to position circuit boards 11a and 11b inside the case. On the top of case 22 (which is on the bottom in the drawing in FIG. 4) are two knobs and one button (none of which are shown in the drawing) corresponding to modular switches 12, 13 and 14 on circuit board 11a. Three more knobs, 24, 24 and 25, correspond to modular switches 12, 13 and 14 on circuit board 11b. Knobs 24 and 25, which correspond to modular switches 12 and 13 respectively, operate by rotating freely. The lower ends of knobs 24 and 25 are formed into arms (not pictured) which engage with elements 12a and 13a on modular switches 12 and 13 to actuate those switches. On the button corresponding to modular switch 14 (not pictured), which goes up and down, is an arm which actuates element 14a on switch 14 by pushing on it.

On a portion of the bottom (the top in FIG. 4) of cover 23 is formed hollow chamber 26, into which connectors 15 are inserted so as to hold them in position. When switch apparatus 21 has been completely assembled, female connector 27 is attached to connectors 15. Since the operation of the switches in apparatus 21, shown in FIGS. 3 and 4 above, is identical to that of the previous embodiment, its explanation is omitted.

We shall next discuss the functional effects of switch apparatuses 1 and 21 in the embodiments discussed above. Circuit boards 3a and 3b and 11a and 11b are oriented so that they face each other at a right angle to the surface on which the operating knobs (and buttons) are arranged. To the sides which face each other, are mounted modular switches 2 and components 12, 13 and 14. Thus all soldering is confined to the opposite sides of boards 3a and 3b and 11a and 11b. This scheme simplifies the production process and lowers the cost. In the second example, the components were mounted on a single circuit board 11, and, after the board was soldered, it was cut into two boards, 11a and 11b. In this way all the components can be soldered to the board in a single soldering process. Although the width and depth allowed for switch apparatus 1 or 21 in a car door cannot be increased, there is a certain amount of leeway in the height allowance. If circuit boards 3a and 3b or 11a and 11b are soldered on one side only and the surface area of the boards, as seen in a plan view, is increased to the limit imposed by the height of switch apparatus 1 or 21, the wiring pattern will be easier to lead around.

Circuit boards 3a and 3b or 11a and 11b are placed at right angles to the surface on which are arranged the operating knobs (and buttons). This contrasts with the prior art scheme, in which a circuit board was oriented horizontally with respect to the surface with the knobs, and the modular switches were mounted to the top of the board. With our design, modular switches 2, 12, 13 and 14 can be moved up or down to a certain extent on the opposing sides of boards 3a and 3b or 11a and 11b. This makes it easier to adjust the strokes of actuator arm 7b of knob 7 and element 2a of modular switch 2, and the strokes of the actuators on knobs 24 and 25 and elements 12a and 13a on modular switches 12 and 13.

By the same token, the terminals of connectors 5 and 15 can easily be made to meet the surface to be soldered, which enhances the freedom which may be exercised in designing the pattern. Even if the surface area of circuit boards 3a and 3b or 11a and 11b as seen in a plan view, is expanded to the limit imposed by the height of switch apparatus 1 or 21, as described above, the overall height of switch apparatus 1 will not be increased very much, as connectors 5 or 15 are placed in the space between boards 3a and 3b or 11a and 11b. It is thus possible to reduce the width and depth of switch apparatus 1 or 21, as seen in a plan view, making them well suited for installation in the limited space of a car door.

As discussed above, in the switch apparatus described above, multiple circuit boards on which switches are mounted are placed facing each other at right angles to the surface on which a row of operating knobs is arranged. This scheme makes it simple to connect the switches and connectors to the board by soldering only one side of it. It reduces the number of production processes required and so reduces the cost. This arrangement also allows the area of the boards to be increased to the very limit imposed by the height of the apparatus. This makes it easier to lead the wiring pattern around the board and increases the freedom which the designer may exercise.

In the switch apparatus described of this application, multiple circuit boards are placed so that the sides on which the components are mounted face each other. This scheme allows all the components to be soldered on one side of the board only, and achieves results identical to those outlined above.

In the switch apparatus described above of this application, the connectors are placed in the space between the circuit boards. This arrangement makes it simple to wire the connectors to the boards by soldering one side of the boards only, and it reduces the overall height of the switch apparatus.

The power window switch apparatus for an automobile which is described above of this application uses one of the switch apparatuses above. Since these designs allow the surface area of the apparatus, when viewed from above, to be reduced, they effectively produce a switch apparatus which can be installed in the limited space in a car door.

What is claimed is:

1. A switch apparatus comprising:

a casing substantially enclosing said switch apparatus having at least a vertical wall and a top surface;

a plurality of sliding switches, each of said plurality of sliding switches having a sliding element which slides linearly;

a pair of printed circuit boards mounted in said case substantially parallel to each other and to said vertical wall of said case such that an inner side of a first printed circuit board of said pair faces an inner side of a second printed circuit board of said pair; and a plurality of knobs on said top surface of said casing connected to said plurality of sliding switches for actuating each of said plurality of sliding switches;

wherein said plurality of sliding switches are mounted onto said inner sides of said pair of printed circuit boards such that said plurality of switches are disposed in an area between said pair of printed circuit boards; and wherein each said sliding element slides linearly along an inner side of one of said pair of printed circuit boards on which a switch corresponding to said sliding element is mounted.

2. A switch apparatus according to claim 1, wherein said knobs actuate said plurality of sliding switches by a plurality of actuator arms, lengths of said actuator arms depending on a spatial distance between said knobs and said plurality of sliding switches in order to adjust a stroke of said actuator arms.

3. A switch apparatus according to claim 1, wherein outer sides of said printed circuit boards are configured only with soldering sides which fix a plurality of electrical components on said printed circuit boards.

4. A switch apparatus according to claim 1 further comprising a connector between said inner sides of said printed circuit boards to facilitate electronic connection between said plurality of printed circuit boards and an outer circuit.

5. A switch apparatus according to claim 1 wherein said switch apparatus is positioned in an automobile such that operation of one of said plurality of knobs opens and closes a window of said automobile.

6. A switch apparatus comprising:

a casing substantially enclosing said switch apparatus having at least a vertical wall and a top surface;

a plurality of switches;

a mounting for said switches including a pair of printed circuit boards; and a plurality of knobs on said top surface of said case to actuate said plurality of switches;

wherein said pair of printed circuit boards stand vertically and substantially parallel to said vertical wall of said case, an inner side of each said circuit board facing said inner side of another of said circuit boards; and at least one of said plurality of switches is mounted to one of said pair of printed circuit boards and at least one other of said plurality of switches is mounted to the other of said pair of printed circuit boards.

7. A switch apparatus according to claim 6, wherein said knobs actuate said plurality of sliding switches by a plurality of actuator arms having lengths dependent upon the position where said switches are mounted to said printed circuit boards.

8. A switch apparatus according to claim 6, wherein outer sides of said printed circuit boards are configured only with soldering sides which fix a plurality of electrical components on said printed circuit boards.

9. A switch apparatus according to claim 6 further comprising a connector between said inner sides of said printed circuit boards to facilitate electronic connection between said plurality of printed circuit boards and an outer circuit.

10. A switch apparatus according to claim 6, wherein only said inner sides of said pair of printed circuit boards are configured with components thereon.

11. A switch apparatus according to claim 6, wherein said switch apparatus is positioned in an automobile such that operation of said knob opens and closes a window of said automobile.

* * * * *